(12) United States Patent
Dick et al.

(10) Patent No.: US 7,514,847 B2
(45) Date of Patent: Apr. 7, 2009

(54) PIEZO ACTUATOR COMPRISING MEANS FOR COMPENSATING THERMAL LENGTH MODIFICATIONS AND FUEL INJECTION VALVE COMPRISING A PIEZO ACTUATOR

(75) Inventors: Jürgen Dick, Laaber (DE); Heinz Lixl, Regensburg (DE); Martin Simmet, Bad Abbach (DE)

(73) Assignee: Siemens Aktiengesellschaft, Munich (DE)

( * ) Notice: Subject to any disclaimer, the term of this patent is extended or adjusted under 35 U.S.C. 154(b) by 441 days.

(21) Appl. No.: 10/597,102

(22) PCT Filed: Jan. 11, 2005

(86) PCT No.: PCT/EP2005/050092

§ 371 (c)(1),
(2), (4) Date: Jul. 11, 2006

(87) PCT Pub. No.: WO2005/066486

PCT Pub. Date: Jul. 21, 2005

(65) Prior Publication Data

US 2007/0113536 A1 May 24, 2007

(30) Foreign Application Priority Data

Jan. 12, 2004 (DE) .................... 10 2004 001 679

(51) Int. Cl.
*H01L 0/83* (2006.01)
(52) U.S. Cl. .................... 310/328; 310/366; 239/533.2
(58) Field of Classification Search .............. 310/311, 310/328, 366
See application file for complete search history.

(56) References Cited

U.S. PATENT DOCUMENTS

| 5,740,969 | A | * | 4/1998 | Hoffmann et al. ......... 239/533.2 |
| 6,085,990 | A | * | 7/2000 | Augustin .................... 239/88 |
| 2003/0127615 | A1 | * | 7/2003 | Fischer et al. ............. 251/57 |
| 2005/0017096 | A1 | * | 1/2005 | Bachmaier et al. ......... 239/584 |
| 2006/0113870 | A1 | * | 6/2006 | Kienzler et al. ............ 310/328 |

FOREIGN PATENT DOCUMENTS

| DE | 19538791 A1 | 10/1995 |
| DE | 19538791 C2 | 10/1995 |

(Continued)

OTHER PUBLICATIONS

International Search report (with Written Opinion), PCT/EP2005/050092, 15 pages, mailed May 2, 2005.

(Continued)

*Primary Examiner*—Thomas M Dougherty
*Assistant Examiner*—Bryan P Gordon
(74) *Attorney, Agent, or Firm*—Baker Botts L.L.P.

(57) ABSTRACT

In an actuator unit, the piezo actuator (1) is located inside a tubular spring (3) under pre-stress. To compensate the thermal length modifications of the piezo actuator (1) in relation to the actuator housing (4, 3, 6, 5), the compensation element is configured as an aluminium compensation cylinder (2) that is situated in an extension tube (6). The piezo actuator (1) and the compensation cylinder (2) are mounted in series and conjointly pre-stressed by means of the tubular spring (3) that is extended in relation to the actuator housing by the extension tube (6).

17 Claims, 5 Drawing Sheets

FOREIGN PATENT DOCUMENTS

| | | |
|---|---|---|
| DE | 19619319 | 5/1996 |
| DE | 19702066 | 1/1997 |
| DE | 19807903 A1 | 2/1998 |
| DE | 10159748 A1 | 12/2001 |
| EP | 0869278 A | 10/1998 |

OTHER PUBLICATIONS

V.M. Rumphorst; "Ein neues elektronisches Hochdruck-Einspritzsystem für Dieselmotoren"; MTZ Motortechnische Zeitschrift 56, 3; pp. 142-148, 1995.

* cited by examiner

PIEZO ACTUATOR COMPRISING MEANS FOR COMPENSATING THERMAL LENGTH MODIFICATIONS AND FUEL INJECTION VALVE COMPRISING A PIEZO ACTUATOR

CROSS-REFERENCE TO RELATED APPLICATIONS

This application is a U.S. national stage application of International Application No. PCT/EP2005/050092 filed Jan. 11, 2005, which designates the United States of America, and claims priority to German application number DE 10 2004 001 679.8 filed Jan. 12, 2004, the contents of which are hereby incorporated by reference in their entirety.

TECHNICAL FIELD

The invention relates to a piezo actuator and to a fuel injection valve for an internal combustion engine with an actuator unit permanently connected to a valve housing, which features at least one piezo actuator inserted into the valve housing under pre-stress, with a compensation element being arranged between the piezo actuator and a top plate of the actuator housing to compensate for the different thermally-induced changes in length of the piezo actuator in relation to the actuator housing.

BACKGROUND

An injection valve of this type is already known from EP 0 869 278 A1.

High-pressure accumulator injection systems are increasingly being used for supplying fuel to internal combustion engines. Such injection systems are known as common-rail systems (for diesel engines) and HPDI injection systems (for petrol engines). With these injection systems the fuel is delivered with a high pressure pump into a pressure store common to all cylinders of the engine from which the injection valves on the individual cylinders are supplied with fuel. The opening and closing of the injection valves can be controlled electromagnetically or electrically; in the present case electrical piezo actuators are employed to do this.

The extension which occurs in the axial direction on activation of the piezo actuator is exploited via a direct or indirect effective connection with the injection needle of the valve to control the injection of fuel, with a relatively sensitive adjustment between piezo actuator and injection valve being a requirement. The different coefficients of thermal expansion of the piezo ceramic and the surrounding materials produce the problem of compensating for the different length extensions induced by the necessarily wide range of operating temperatures in a motor vehicle in order to avoid a de-adjustment of the valve stroke.

As well as the earlier usual hydraulic compensation element, different non-hydraulic measures to compensate for the length extension of the piezo actuator and of a surrounding actuator housing or valve housing have become known in the interim. For example a piezo actuator valve is known from DE 195 38 791 C2 in which the valve housing itself is embodied as a two-part sleeve with sleeve parts arranged axially behind each other consisting of different materials with different coefficients of expansion. In the generic patent application EP 0 869 278 A1 two further compensation options which are also independent of each other but can also be combined are specified. On the one hand it is proposed that a coefficient of expansion be selected for the material of the actuator housing surrounding the actuator which is almost equal to the coefficient of expansion of the piezo actuator. On the other hand at least one compensation spacer arranged between the piezo actuator and the cover plate of the actuator housing with a relatively high coefficient of thermal expansion is proposed which is suitable for compensating for the small coefficients of expansion of the piezo actuator in relation to the actuator housing.

A particular problem of the temperature compensation described occurs in connection with the necessary pre-stressing of the piezo actuator in the actuator housing. Since tension stresses in the piezo ceramic actuator material are to be avoided at all costs the unpowered piezo actuator is pre-stressed by means of spring force in a defined manner. The powered piezo actuator must thus expand against this pre-stressing. Typically, to create this pre-stressing, as described in the generic EP 0 869 278 A1, a spring arranged between the base plate of the actuator housing and the assigned face side of the piezo actuator is used which presses the actuator against the top plate of the actuator housing and thereby pre-stresses it. Also described is the option of incorporating this type of pre-stressing spring or an assigned control element into the compensation of the different length extension using the choice of material.

Injectors of also known however in which the piezo actuator is pre-stressed within a tubular spring made of steel, which on the one side is welded to the top plate and opposite this, under pre-stressing, welded to the bottom plate. The actuator unit formed from this "housing" together with the piezo actuator accommodated within it under pre-stressing is permanently connected to a valve housing or is built into an injector body. The known measures for compensating for the different length extensions cannot be simply applied to this construction. On the other hand a compensation between piezo actuator and "tubular spring housing" must be undertaken, since otherwise a temperature-dependent change of the pre-stressing and thereby an undesired temperature-dependent activation behavior of the injection valve would be produced.

SUMMARY

The underlying object of the invention is thus, with a generic injection valve, to ensure a constant-temperature pre-stressing with little mechanical outlay even when the piezo actuator is introduced into a tubular spring under pre-stressing.

In accordance with the invention this object can be achieved by a piezo actuator for a fuel injection valve which is inserted under pre-stressing into an actuator housing, with a compensation element to compensate for the different thermally-induced changes in length in relation to the actuator housing being incorporated between the piezo actuator and a top plate of the actuator housing, wherein the piezo actuator is arranged within a tubular spring, the compensating element is embodied as a compensating cylinder arranged within an extension tube, the actuator housing comprises a sleeve consisting of the tubular spring and the extension tube fixed to it, the extension tube end of which is permanently connected to the top plate and the tubular spring end of which, in exerting a defined pre-stressing on the parts arranged axially behind each other within the sleeve, is permanently connected to a base plate of the actuator housing.

The parts of the actuator housing can be made of steel. The parts of the actuator housing can be welded to each other at their connecting points. The compensating cylinder may consist of aluminum. A spacer can be arranged between piezo actuator and compensating cylinder. Breakthroughs can be made in the circumference of the extension tube in which a spring plate can be mounted in each case so that, with an actuator unit fitted, a heat transfer can be produced from the compensating cylinder to a housing of the injection valve. The spring plates can be made of the material copper, copper-beryllium or bronze in each case. A groove for caulking the actuator unit in the valve housing can be incorporated into the top plate of the actuator housing. An injection valve can be fitted with such a piezo actuator.

In accordance with the invention, in a generic injection valve the piezo actuator is arranged within a tubular spring. In addition the compensation element is embodied as a compensation cylinder arranged within an extension tube. The actuator housing comprises a two-part sleeve consisting of the tubular spring and the extension tube permanently connected to it, of which the extension tube-side end is permanently connected to the top plate and of which the tubular spring-side end, exerting a defined pre-stressing on the parts arranged behind each other within the sleeve, is permanently connected to the bottom plate of the actuator housing.

The idea behind the invention is thus to mount the piezo actuator and the compensating cylinder in series in an "actuator housing" and to pre-stress them jointly by means of extended tubular spring in relation to the "actuator housing". The actuator housing consists of a top plate, extension tube, tubular spring and base plate. This produces a structure in which the sum of the heat expansions of the inner parts (piezo ceramic plus material of the compensating cylinder) is equal to the heat expansion of the actuator housing. This means that the pre-stressing on the piezo ceramic set during installation only varies slightly if the temperature changes. In addition this produces a stable structure of the actuator unit which in particular allows its stable fixing in the valve housing.

With one embodiment of the invention it is of advantage if the parts of the actuator housing are made of steel, meaning that the actuator housing expands equally and overall in a defined manner in all its parts.

It is further of advantage to weld the parts of the actuator housing together at the connection points to achieve the required rigidity of the connections between the parts of the actuator housing.

In accordance with a specially preferred embodiment of the invention the compensation cylinder is made of aluminum. This material combines the desired expansion behavior with an advantageously high rigidity as well as a low weight.

The expansion behavior of the inner parts or the geometry of the actuator unit overall can be influenced in a simple manner by arranging a spacer between piezo actuator and compensation cylinder.

It is of advantage for breakthroughs to be incorporated into the circumference of the extension tube in which a spring plate is mounted in each case such that, with an actuator unit installed, a transfer of heat from the compensating cylinder to the valve housing is produced. In this case it is also of advantage for the spring plates to be made in each case of the material copper, copper-beryllium or bronze.

An outstanding feature of a further embodiment of the invention is that the top plate of the actuator housing incorporates a slot to caulk the actuator unit into the valve housing.

BRIEF DESCRIPTION OF THE DRAWINGS

An exemplary embodiment of the invention is explained in more detail below on the basis of the drawing. The figures show.

DETAILED DESCRIPTION

Figure 1:
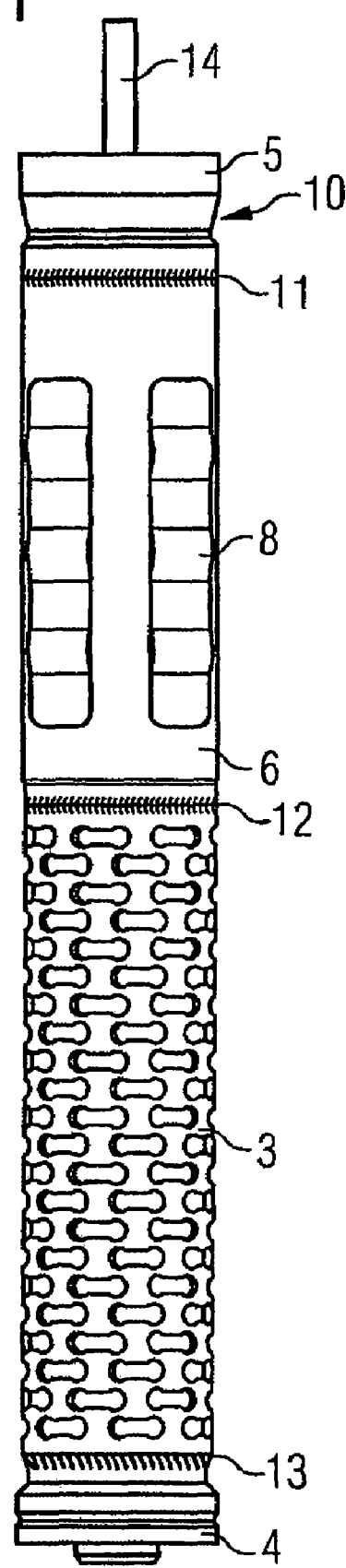
FIG. 1 the actuator unit,
FIG. 2 a longitudinal cross section through the actuator unit shown in FIG. 1,
FIG. 3 a further longitudinal cross section through the actuator unit shown in FIG. 1,
FIG. 4 an overview diagram of the actuator unit as shown in FIGS. 1 to 3, and
FIG. 5 a section of part of an injection valve.

FIG. 1 shows the actuator unit installed, with the parts of the actuator housing, that is the bottom plate 4, the tubular spring 3 welded to it, the extension tube 6 welded to it and the top plate 5 welded to it being recognizable in the diagram. The top plate features holes drilled in it through which terminal posts 14 of the piezo actuator 1 are brought out. Also indicated FIG. 1 are the welds 11, 12 and 13 for connection of the parts 5, 6, 3 and 4 of the actuator housing. Also shown in FIG. 1 are the breakthroughs made in the extension tube 6, in which spring plates 8 made of copper, copper-beryllium or bronze are mounted. These spring plates 8 ensure a fast heat transfer between the internal compensation cylinder (not visible here) and the valve housing so that the function of length compensation can be optimally fulfilled for temperature changes.

Also shown in FIG. 1 is a groove 10 made in the top plate which can be used for interference-fit caulking of the actuator unit in the valve housing.

Figure 2:
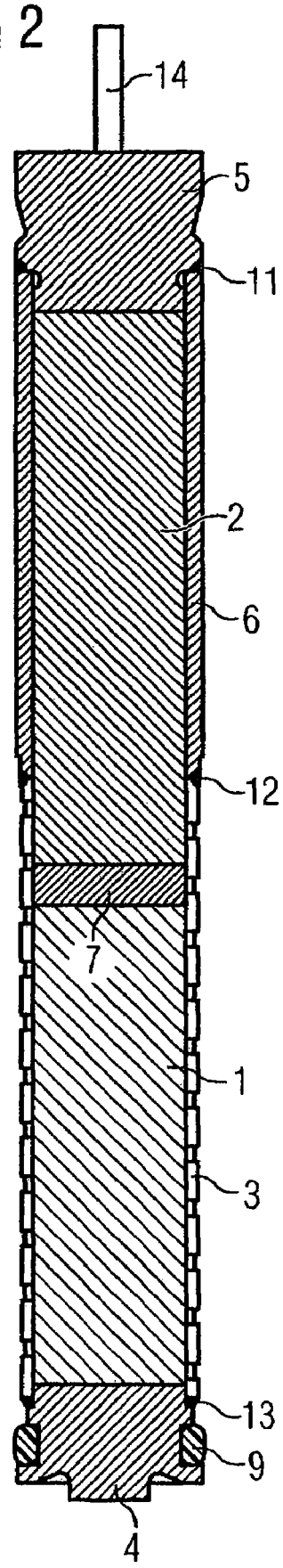

FIG. 2 shows a cross-section (at right-angles to the plane of the terminal posts 14) through the actuator unit. In particular the internal structure of the actuator unit can be seen in which the piezo actuator, a spacer 7 and the aluminum compensating cylinder 2 are mounted in series axially behind one another. These internal parts 1, 7 and 2 are surrounded by the actuator housing which consists of the bottom plate 4, the tubular spring 3, the extension tube 6 and the cover plate 5, which expediently consist of steel parts welded to one another resulting in a uniform, defined, thermal length expansion of the actuator housing overall. The combination of piezo ceramic 1 and aluminum 2 is thus surrounded by a common steel housing 4, 3, 6 and 5, with the total extension of the internal parts 1, 7 and 2 essentially corresponding to that of the actuator housing 4, 3, 6 and 5, so that, even with a temperature change the predetermined pre-stressing of the piezo actuator 1 does not vary.

FIG. 2 also shows an O-ring 9 on the base plate 4 which simplifies the centering of the actuator unit in a hole in the injector housing.

Figure 3:
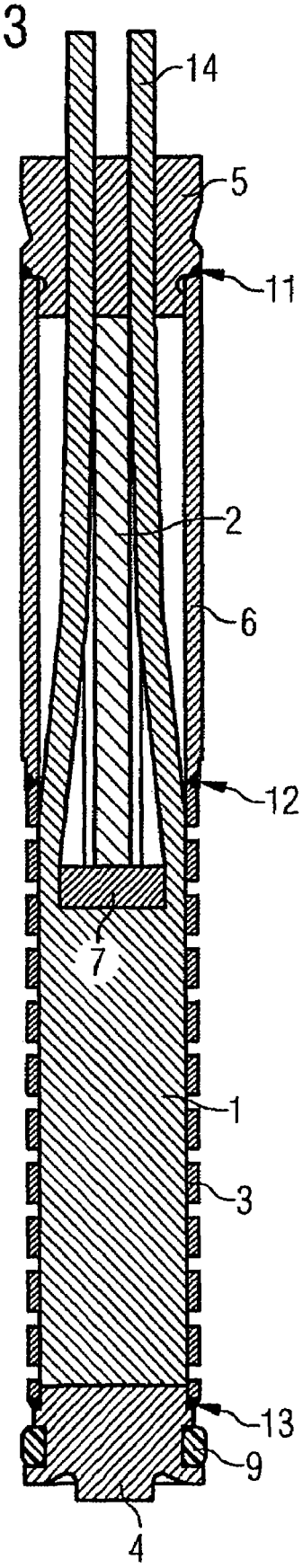

FIG. 3 shows a cross-section (along the plane formed by the terminal posts 14) through the actuator unit. In this diagram the terminal posts 14 fed through the holes in the top plate 5 and onwards in side slits 15 (cf. FIG. 4) of the aluminum compensating cylinder 2 of the piezo actuator 1 can be seen particularly well.

Figure 4:
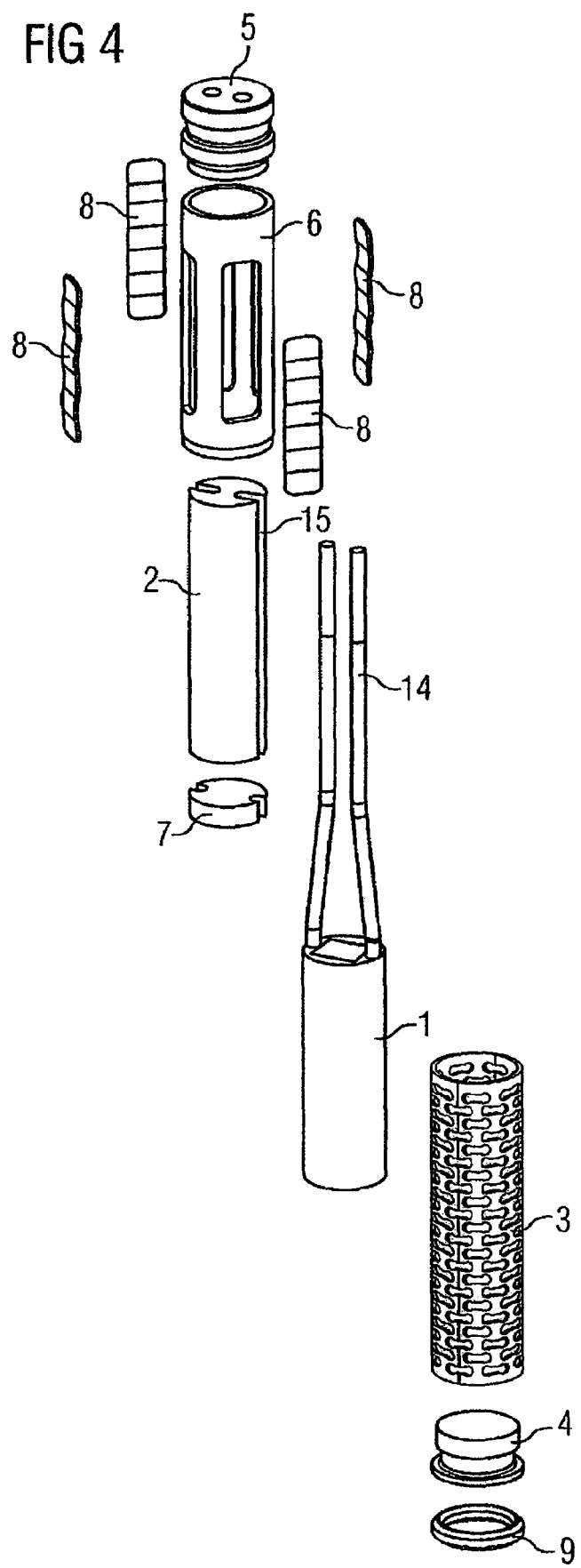

FIG. 4 shows the overall structure of actuator unit in overview. For assembly the top plate 5 and the extension tube 6 can initially be joined by a weld 11. Thereafter the tubular spring 3 is welded with the weld 12 to the extension tube 6. Now the internal parts, that is the piezo actuator 1 with its terminals or terminal posts 14, the spacer 7 and also the aluminum compensation cylinder 2 with its side slits 15 provided for the terminal posts 14 in each case, can be assembled into the sleeve comprising parts 3 and 6 with the top plate 5 already welded on. Finally the base plate 4 can be connected by means of the weld 13 to the tubular spring 3, exerting a predetermined pre-stressing on the internal parts, especially on the piezo actuator 1.

Figure 5:
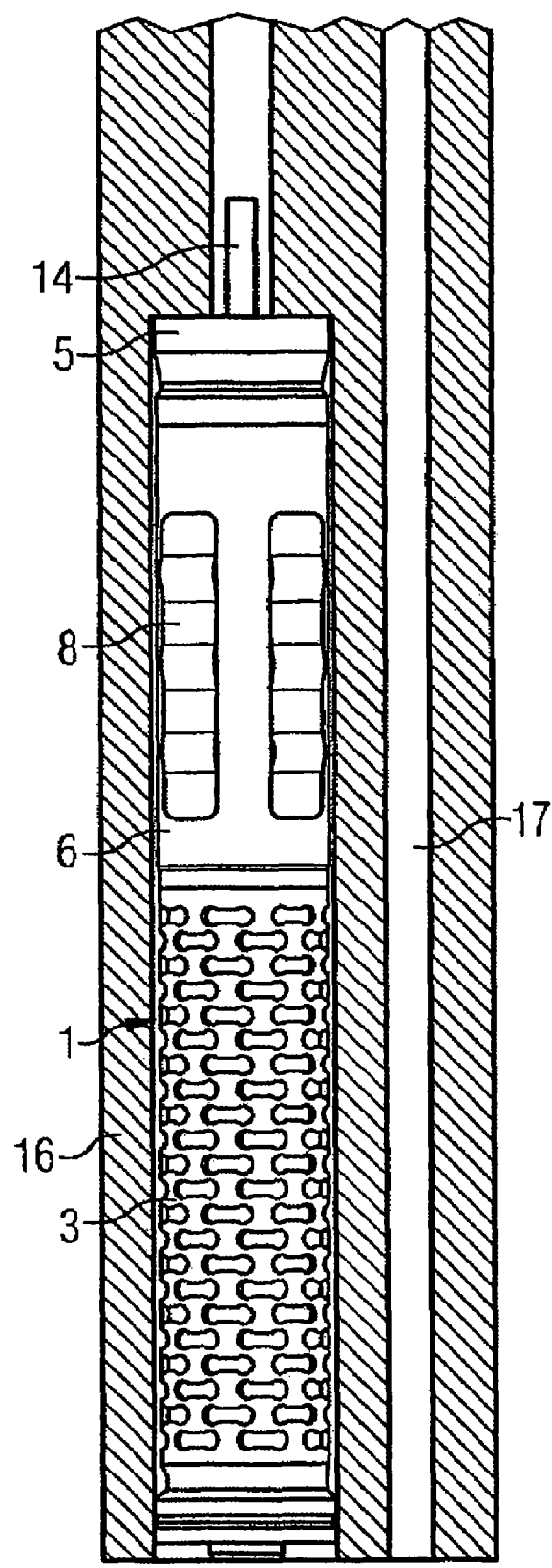

Depending on the embodiment selected, the tubular spring 3 and the extension tube can also be designed in one piece as one component, as is shown in FIG. 5. FIG. 5 shows a part of the housing 16 of the injection valve. A fuel inlet hole 17 is embodied in the housing 16 which feeds fuel to an injection needle. The housing 16 is preferably arranged in the upper area of the injection valve and the piezo actuator 1 is used for activation of a servo valve which controls the pressure in a control chamber. The injector needle is moved depending on the pressure in the control chamber into an open or closed position. Fuel is delivered in the open position. Depending on the embodiment, the piezo actuator 1 can also control the injection needle directly.

The overall result is an inventive injection valve with a compact drive unit which can be fixed stably in the injector, the piezo actuator of which has a constant-temperature pre-stressing.

What is claimed is:

1. A piezo actuator for a fuel injection valve which is inserted under pre-stressing into an actuator housing, with a compensation element to compensate for the different thermally-induced changes in length in relation to the actuator housing being incorporated between the piezo actuator and a top plate of the actuator housing,
wherein
    the piezo actuator is arranged within a tubular spring,
    the compensating element is embodied as a compensating cylinder arranged within an extension tube,
    the actuator housing comprises a sleeve consisting of the tubular spring and the extension tube fixed to it, the extension tube end of which is permanently connected to the top plate and the tubular spring end of which, in exerting a defined pre-stressing on the parts arranged axially behind each other within the sleeve, is permanently connected to a base plate of the actuator housing.

2. A piezo actuator according to claim 1,
wherein the parts of the actuator housing are made of steel.

3. A piezo actuator according to claim 1,
wherein the parts of the actuator housing are welded to each other at their connecting points.

4. A piezo actuator according to claim 1,
wherein the compensating cylinder consists of aluminum.

5. A piezo actuator according to claim 1,
wherein a spacer is arranged between piezo actuator and compensating cylinder.

6. A piezo actuator according to claim 1,
wherein breakthroughs are made in the circumference of the extension tube in which a spring plate is mounted in each case so that, with an actuator unit fitted, a heat transfer is produced from the compensating cylinder to a housing of the injection valve.

7. A piezo actuator according to claim 6,
wherein the spring plates are made of the material copper, copper-beryllium or bronze in each case.

8. A piezo actuator according to claim 1,
wherein a groove for caulking the actuator unit in the valve housing is incorporated into the top plate of the actuator housing.

9. An injection valve with a piezo actuator according to claim 1.

10. A method for manufacturing a piezo actuator for a fuel injection valve comprising a compensation element to compensate for the different thermally-induced changes in length in relation to the actuator housing being incorporated between the piezo actuator and a top plate of the actuator housing, the method comprising the steps of:
    arranging the piezo actuator within a tubular spring,
    embodying the compensating element as a compensating cylinder arranged within an extension tube,
    fixing the extension tube to a sleeve consisting of the tubular spring, and
    connecting an extension tube end permanently to the top plate and connecting the tubular spring end permanently to a base plate of the actuator housing by exerting a defined pre-stressing on the parts arranged axially behind each other within the sleeve.

11. A method according to claim 10,
wherein the parts of the actuator housing are made of steel.

12. A method according to claim 10,
wherein the parts of the actuator housing are welded to each other at their connecting points.

13. A method according to claim 10,
wherein the compensating cylinder consists of aluminum.

14. A method according to claim 10,
wherein a spacer is arranged between piezo actuator and compensating cylinder.

15. A method according to claim 10,
wherein breakthroughs are made in the circumference of the extension tube in which a spring plate is mounted in each case so that, with an actuator unit fitted, a heat transfer is produced from the compensating cylinder to a housing of the injection valve.

16. A method according to claim 15,
wherein the spring plates are made of the material copper, copper-beryllium or bronze in each case.

17. A method according to claim 10,
wherein a groove for caulking the actuator unit in the valve housing is incorporated into the top plate of the actuator housing.

* * * * *